United States Patent [19]

Roberson et al.

[11] 3,967,206

[45] June 29, 1976

[54] DUAL EDGE AND LEVEL (DEL) FLIP-FLOP

[75] Inventors: Donald L. Roberson; Donald K. Fronek, both of Huntsville, Ala.

[73] Assignee: The United States of America as represented by the Secretary of the Army, Washington, D.C.

[22] Filed: Mar. 19, 1975

[21] Appl. No.: 559,953

[52] U.S. Cl. .............................. 328/206; 307/289; 328/196
[51] Int. Cl.² ..................... H03K 3/12; H03K 3/286
[58] Field of Search ............ 307/289, 291; 328/206, 328/95, 97, 196

[56] References Cited
UNITED STATES PATENTS

| | | | |
|---|---|---|---|
| 3,446,994 | 5/1969 | Treadway | 307/291 X |
| 3,541,356 | 11/1970 | Lagemann | 307/291 X |

*Primary Examiner*—John Zazworsky
*Attorney, Agent, or Firm*—Nathan Edelberg; Robert P. Gibson; Robert C. Sims

[57] ABSTRACT

The dual edge and level (DEL) flip-flop not only is sensitive to both positive and negative edges and level inputs, but the device can be made sensitive to (1) positive edges only, (2) negative edges only, (3) both positive and negative edges, or (4) neither positive or negative edges. In any case, the output can be controlled by the level inputs which override the edge operation.

4 Claims, 2 Drawing Figures

DUAL EDGE AND LEVEL (DEL) FLIP-FLOP

DEDICATORY CLAUSE

The invention described herein may be manufactured, used, and licensed by or for the Government for governmental purposes without the payment to me of any royalties thereon.

DESCRIPTION OF THE PREFERRED EMBODIMENT

In the design of many digital circuits, a flip-flop is employed as a storage device and is the very basis of sequential circuit realization. Classically, the flip-flop has been effectively employed as the design algorithms were developed for existing devices. With the advent of integrated circuits, a very complicated device could be developed and remain small enough in size to be useful. The philosophy of designing flip-flops to suit the logic designer followed the integrated circuit era; this is in contrast to using flip-flops commercially available with the existing design algorithms.

Recently, much attention has been focused toward flip-flops that are excited using the "edge" of the wave form rather than the amplitude of the digital signal. An efficient algorithm for designing sequential circuits using edge and level flip-flops was presented by Fronek in 1973. Maximum use of this procedure required the development of a new flip-flop that was not commercially available. This new device, the Dual Edge and Level (DEL) Flip-Flop is the subject invention.

Flip-flops that are presently available commercially are either positive or negative edge sensitive in addition to being sensitive to level inputs. The DEL flip-flop can be made sensitive to (1) positive edges, (2) negative edges, (3) both positive and negative edges, or (4) neither positive nor negative edges. Fronek has shown that generally the external gate logic required when using flip-flops to perform a logic function can be minimized if the flip-flop functions according to this criteria.

Figure 1:
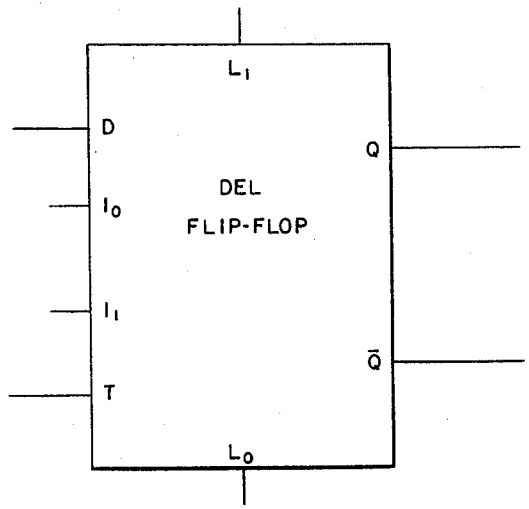
FIG. 1 is a block diagram showing the connections to the DEL flip-flop.

The input-output connections of the DEL flip-flop are shown in FIG. 1. The operation of the DEL flip-flop is as follows:

1. The output, Q, changes to the state of the input at D whenever a positive ($\Delta$) or negative ($\nabla$) transition occurs at T subject to the transition selection inpug, $I_0$ and $I_1$:
   a. The DEL is sensitive to $\Delta T$ when $I_1 = 1$
   b. The DEL is sensitive to $\nabla T$ when $I_0 = 1$
   c. The DEL is sensitive to $\Delta T$ and $\nabla T$ when $I_1 = I_0 = 1$
2. $L_0$ and $L_1$ are level inputs that override the edge operation previously given:
   a. $Q = 0$ when $L_0 = 0$
   b. $Q = 1$ when $L_1 = 0$ This operation is summarized in Table I:

TABLE I

DEL TRUTH TABLE

| D | $I_0$ | $I_1$ | T | $L_0$ | $L_1$ | $Q^+$ | $\overline{Q}^+$ |
|---|---|---|---|---|---|---|---|
| 0 | 0 | 0 | $\nabla$ | 1 | 1 | Q | $\overline{Q}$ |
| 0 | 0 | 0 | $\Delta$ | 1 | 1 | Q | $\overline{Q}$ |
| 0 | 0 | 1 | $\nabla$ | 1 | 1 | Q | $\overline{Q}$ |
| 0 | 0 | 1 | $\Delta$ | 1 | 1 | 0 | 1 |
| 0 | 1 | 0 | $\nabla$ | 1 | 1 | 0 | 1 |
| 0 | 1 | 0 | $\Delta$ | 1 | 1 | Q | $\overline{Q}$ |
| 0 | 1 | 1 | $\nabla$ | 1 | 1 | 0 | 1 |
| 0 | 1 | 1 | $\Delta$ | 1 | 1 | 0 | 1 |
| 1 | 0 | 0 | $\nabla$ | 1 | 1 | Q | $\overline{Q}$ |
| 1 | 0 | 0 | $\Delta$ | 1 | 1 | Q | $\overline{Q}$ |
| 1 | 0 | 1 | $\nabla$ | 1 | 1 | Q | $\overline{Q}$ |
| 1 | 0 | 1 | $\Delta$ | 1 | 1 | 1 | 0 |
| 1 | 1 | 0 | $\nabla$ | 1 | 1 | 1 | 0 |
| 1 | 1 | 0 | $\Delta$ | 1 | 1 | Q | $\overline{Q}$ |
| 1 | 1 | 1 | $\nabla$ | 1 | 1 | 1 | 0 |
| 1 | 1 | 1 | $\Delta$ | 1 | 1 | 1 | 0 |
| — | — | — | — | 0 | 0 | 1 | 1** |
| — | — | — | — | 0 | 1 | 0 | 1 |
| — | — | — | — | 1 | 0 | 1 | 0 |

**For Q and $\overline{Q}$ to be algebraic, this input condition is not allowed.
— "Don't Care".

By using the DEL flip-flop, the logic designer can now use one flip-flop to perform the functions previously required of several devices and also minimize the cost and increase the speed of the design.

Figure 2:
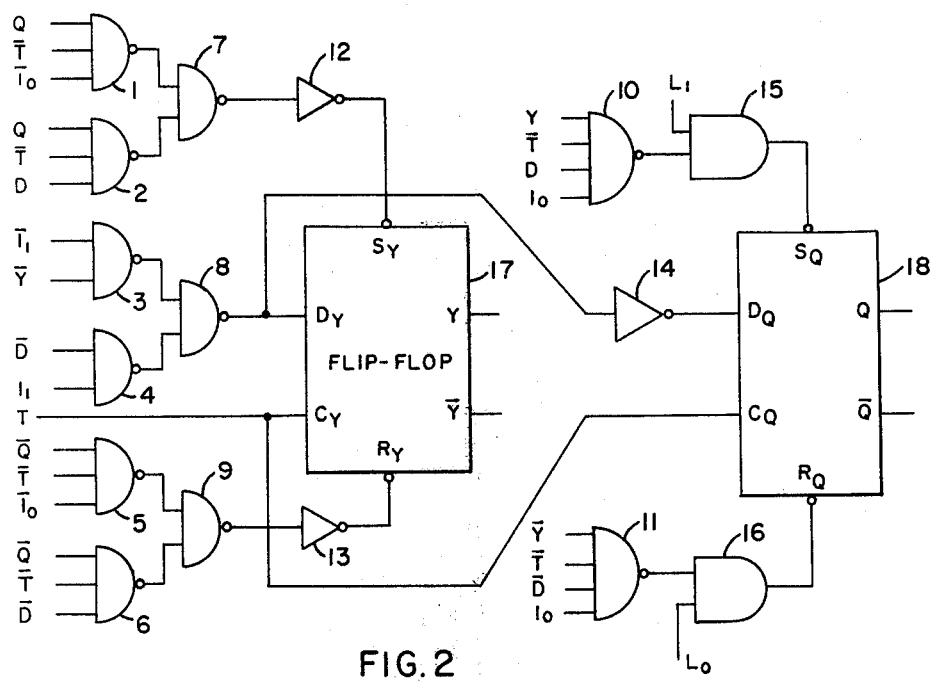
FIG. 2 is a logic schematic of the DEL flip-flop.

A logic schematic of the DEL flip-flop is shown in FIG. 2. This representation uses commercially available devices, but the final product can be one integrated circuit package performing the same functions. The circuit consists of eleven NAND gates 1–11, three inverters 12–14, two AND gates 15 and 16, and two positive edge D flip-flops 17 and 18. The flip-flops 17 and 18 have sensitive activating level of "O" at $S_Y$, $R_Y$, $S_Q$ and $R_Q$ as indicated by the circle shown in the connections from inverters 12 and 13 and AND gates 15 and 16. The operation of the circuit of FIG. 2 is best explained by reference to the figure and to the DEL Analysis Table II.

TABLE II

DEL ANALYSIS

| Y | Q | T | D | $I_1$ | $I_0$ | $D_Y$ | $S_Y$ | $R_Y$ | $Y^+$ | $D_Q$ | $S_Q$ | $R_Q$ | $Q^+$ |
|---|---|---|---|---|---|---|---|---|---|---|---|---|---|
| 0 | 0 | 0 | 0 | 0 | 0 | 1 | 1 | 0 | 0 | 0 | 1 | 1 | 0 |
| 0 | 0 | 1 | 0 | 0 | 0 | 1 | 1 | 0 | 0 | 0 | 1 | 1 | 0 |
| 0 | 0 | 0 | 0 | 0 | 1 | 1 | 1 | 0 | 0 | 0 | 1 | 0 | 0 |
| 0 | 0 | 1 | 0 | 0 | 1 | 1 | 1 | 1 | 0 | 0 | 1 | 1 | 0 |
| 0 | 0 | 0 | 0 | 1 | 0 | 1 | 1 | 0 | 0 | 0 | 1 | 1 | 0 |
| 0 | 0 | 1 | 0 | 1 | 0 | 1 | 1 | 1 | 0 | 0 | 1 | 1 | 0 |
| 0 | 0 | 0 | 0 | 1 | 1 | 1 | 1 | 0 | 0 | 0 | 1 | 0 | 0 |
| 0 | 0 | 1 | 0 | 1 | 1 | 1 | 1 | 1 | 0 | 0 | 1 | 1 | 0 |
| 0 | 0 | 0 | 1 | 0 | 0 | 1 | 1 | 0 | 0 | 0 | 1 | 1 | 0 |
| 0 | 0 | 1 | 1 | 0 | 0 | 1 | 1 | 1 | 0 | 0 | 1 | 1 | 0 |
| 0 | 0 | 0 | 1 | 0 | 1 | 0 | 1 | 0 | 0 | 1 | 1 | 1 | 0 |
| 0 | 0 | 1 | 1 | 0 | 1 | 0 | 1 | 1 | 1 | 1 | 1 | 1 | 1 |
| 0 | 0 | 0 | 1 | 1 | 0 | 0 | 1 | 1 | 0 | 1 | 1 | 1 | 0 |
| 0 | 0 | 1 | 1 | 1 | 0 | 0 | 1 | 1 | 0 | 1 | 1 | 1 | 0 |
| 0 | 0 | 0 | 1 | 1 | 1 | 0 | 1 | 0 | 0 | 1 | 1 | 1 | 0 |
| 0 | 0 | 1 | 1 | 1 | 1 | 0 | 1 | 1 | 1 | 1 | 1 | 1 | 1 |
| 1 | 1 | 0 | 0 | 0 | 0 | 0 | 1 | 1 | 1 | 1 | 1 | 1 | 1 |
| 1 | 1 | 1 | 0 | 0 | 0 | 0 | 1 | 1 | 1 | 1 | 1 | 1 | 1 |

TABLE II-continued

| Y | Q | T | D | I₁ | I₀ | Dy | Sy | Ry | Y⁺ | Dq | Sq | Rq | Q⁺ |
|---|---|---|---|---|---|---|---|---|---|---|---|---|---|
| | | | | | | DEL ANALYSIS | | | | | | | |
| 1 | 1 | 0 | 0 | 0 | 0 | 1 | 0 | 1 | 1 | 1 | 1 | 1 | 1 |
| 1 | 1 | 1 | 0 | 0 | 0 | 1 | 0 | 1 | 1 | 0 | 1 | 1 | 1 |
| 1 | 1 | 0 | 0 | 0 | 1 | 0 | 1 | 0 | 1 | 1 | 1 | 1 | 1 |
| 1 | 1 | 1 | 0 | 0 | 1 | 0 | 1 | 0 | 1 | 0 | 1 | 1 | 0 |
| 1 | 1 | 0 | 0 | 1 | 0 | 1 | 1 | 1 | 1 | 0 | 1 | 1 | 1 |
| 1 | 1 | 1 | 0 | 1 | 0 | 1 | 1 | 1 | 1 | 0 | 1 | 1 | 0 |
| 1 | 1 | 0 | 1 | 0 | 0 | 0 | 0 | 1 | 1 | 1 | 1 | 1 | 1 |
| 1 | 1 | 1 | 1 | 0 | 0 | 0 | 1 | 1 | 1 | 1 | 1 | 1 | 1 |
| 1 | 1 | 0 | 1 | 0 | 1 | 0 | 0 | 1 | 1 | 1 | 0 | 1 | 1 |
| 1 | 1 | 1 | 1 | 0 | 1 | 0 | 1 | 1 | 1 | 1 | 0 | 1 | 1 |
| 1 | 1 | 0 | 1 | 1 | 0 | 0 | 0 | 1 | 1 | 1 | 1 | 1 | 1 |
| 1 | 1 | 1 | 1 | 1 | 0 | 0 | 1 | 1 | 1 | 1 | 1 | 1 | 1 |
| 1 | 1 | 0 | 1 | 1 | 1 | 0 | 0 | 1 | 1 | 1 | 0 | 1 | 1 |
| 1 | 1 | 1 | 1 | 1 | 1 | 0 | 1 | 1 | 1 | 1 | 0 | 1 | 1 |
| 1 | 0 | 1 | 0 | 0 | 0 | 0 | 1 | 1 | 1 | 1 | 1 | 1 | 0 |
| 1 | 0 | 0 | 0 | 0 | 0 | 0 | 1 | 1 | 0 | 1 | 1 | 1 | 0 |
| 1 | 0 | 1 | 0 | 0 | 1 | 0 | 1 | 1 | 1 | 0 | 1 | 1 | 0 |
| 1 | 0 | 0 | 0 | 0 | 1 | 0 | 1 | 0 | 0 | 1 | 1 | 1 | 0 |
| 1 | 0 | 1 | 0 | 1 | 0 | 1 | 1 | 1 | 1 | 0 | 1 | 1 | 0 |
| 1 | 0 | 0 | 0 | 1 | 0 | 0 | 1 | 0 | 0 | 0 | 1 | 1 | 0 |
| 1 | 0 | 1 | 0 | 1 | 1 | 1 | 1 | 1 | 1 | 0 | 1 | 1 | 0 |
| 1 | 0 | 0 | 0 | 1 | 1 | 1 | 1 | 0 | 0 | 0 | 1 | 1 | 0 |
| 1 | 0 | 1 | 1 | 0 | 0 | 0 | 1 | 1 | 1 | 1 | 1 | 1 | 0 |
| 1 | 0 | 0 | 1 | 0 | 0 | 0 | 1 | 1 | 0 | 1 | 1 | 1 | 0 |
| 1 | 0 | 1 | 1 | 0 | 1 | 0 | 1 | 1 | 1 | 1 | 0 | 1 | 0 |
| 1 | 0 | 0 | 1 | 0 | 1 | 0 | 1 | 0 | 1 | 1 | 0 | 1 | 1 |
| 1 | 0 | 1 | 1 | 1 | 0 | 0 | 1 | 1 | 1 | 0 | 1 | 1 | 0 |
| 1 | 0 | 0 | 1 | 1 | 0 | 0 | 1 | 0 | 0 | 0 | 1 | 1 | 0 |
| 1 | 0 | 1 | 1 | 1 | 1 | 0 | 1 | 1 | 1 | 1 | 0 | 1 | 0 |
| 1 | 0 | 0 | 1 | 1 | 1 | 0 | 1 | 1 | 1 | 1 | 0 | 1 | 1 |
| 0 | 1 | 1 | 0 | 0 | 0 | 1 | 1 | 1 | 0 | 0 | 1 | 1 | 1 |
| 0 | 1 | 0 | 0 | 0 | 0 | 1 | 0 | 1 | 0 | 0 | 1 | 1 | 1 |
| 0 | 1 | 1 | 0 | 0 | 1 | 1 | 1 | 1 | 0 | 0 | 1 | 1 | 1 |
| 0 | 1 | 0 | 0 | 0 | 1 | 1 | 1 | 1 | 0 | 0 | 1 | 0 | 0 |
| 0 | 1 | 1 | 0 | 1 | 0 | 1 | 0 | 1 | 1 | 0 | 1 | 1 | 1 |
| 0 | 1 | 0 | 0 | 1 | 0 | 1 | 0 | 1 | 1 | 0 | 1 | 1 | 1 |
| 0 | 1 | 1 | 0 | 1 | 1 | 1 | 1 | 1 | 1 | 0 | 1 | 1 | 1 |
| 0 | 1 | 0 | 0 | 1 | 1 | 1 | 1 | 1 | 1 | 0 | 1 | 0 | 0 |
| 0 | 1 | 1 | 1 | 0 | 0 | 1 | 1 | 1 | 1 | 0 | 0 | 1 | 1 |
| 0 | 1 | 0 | 1 | 0 | 0 | 0 | 1 | 1 | 1 | 0 | 0 | 1 | 1 |
| 0 | 1 | 1 | 1 | 0 | 1 | 1 | 1 | 1 | 0 | 0 | 1 | 1 | 1 |
| 0 | 1 | 0 | 1 | 0 | 1 | 1 | 1 | 0 | 0 | 0 | 1 | 1 | 1 |
| 0 | 1 | 1 | 1 | 1 | 0 | 0 | 1 | 1 | 0 | 0 | 1 | 1 | 1 |
| 0 | 1 | 0 | 1 | 1 | 0 | 0 | 0 | 1 | 1 | 0 | 1 | 1 | 1 |
| 0 | 1 | 1 | 1 | 1 | 1 | 1 | 1 | 1 | 0 | 0 | 0 | 1 | 1 |
| 0 | 0 | 0 | 0 | 0 | 0 | 1 | 1 | 1 | 0 | 0 | 1 | 1 | 0 |
| 0 | 0 | 0 | 0 | 0 | 1 | 1 | 1 | 1 | 0 | 0 | 0 | 1 | 0 |
| 0 | 0 | 0 | 0 | 1 | 0 | 1 | 1 | 1 | 0 | 0 | 0 | 1 | 0 |
| 0 | 0 | 0 | 0 | 1 | 1 | 1 | 1 | 1 | 0 | 0 | 0 | 1 | 0 |
| 0 | 0 | 0 | 1 | 0 | 0 | 1 | 1 | 1 | 0 | 0 | 0 | 1 | 0 |
| 0 | 0 | 0 | 1 | 0 | 1 | 1 | 1 | 1 | 0 | 0 | 1 | 1 | 0 |
| 0 | 0 | 0 | 1 | 1 | 0 | 1 | 1 | 1 | 0 | 0 | 1 | 1 | 0 |
| 0 | 0 | 0 | 1 | 1 | 1 | 1 | 1 | 1 | 0 | 0 | 0 | 1 | 0 |
| 1 | 1 | 0 | 0 | 0 | 0 | 0 | 0 | 1 | 1 | 1 | 1 | 1 | 1 |
| 1 | 1 | 0 | 0 | 0 | 1 | 0 | 1 | 1 | 1 | 1 | 1 | 1 | 1 |
| 1 | 1 | 0 | 0 | 1 | 0 | 1 | 1 | 1 | 1 | 0 | 1 | 1 | 1 |
| 1 | 1 | 0 | 0 | 1 | 1 | 1 | 1 | 1 | 1 | 0 | 1 | 1 | 1 |
| 1 | 1 | 0 | 1 | 0 | 0 | 0 | 0 | 1 | 1 | 1 | 1 | 1 | 1 |
| 1 | 1 | 0 | 1 | 0 | 1 | 0 | 0 | 1 | 1 | 1 | 0 | 1 | 1 |
| 1 | 1 | 0 | 1 | 1 | 0 | 0 | 0 | 1 | 1 | 1 | 1 | 1 | 1 |
| 1 | 1 | 0 | 1 | 1 | 1 | 0 | 0 | 1 | 1 | 1 | 0 | 1 | 1 |
| 1 | 0 | 0 | 0 | 0 | 0 | 0 | 1 | 1 | 1 | 1 | 1 | 1 | 0 |
| 1 | 0 | 0 | 0 | 0 | 1 | 0 | 1 | 0 | 0 | 1 | 1 | 1 | 0 |
| 1 | 0 | 0 | 0 | 1 | 0 | 0 | 1 | 0 | 0 | 0 | 1 | 1 | 0 |
| 1 | 0 | 0 | 0 | 1 | 1 | 0 | 1 | 0 | 0 | 0 | 1 | 1 | 0 |
| 1 | 0 | 0 | 1 | 0 | 0 | 0 | 1 | 1 | 1 | 1 | 1 | 1 | 0 |
| 1 | 0 | 0 | 1 | 0 | 1 | 0 | 1 | 0 | 1 | 1 | 0 | 1 | 1 |
| 1 | 0 | 0 | 1 | 1 | 0 | 0 | 1 | 0 | 0 | 0 | 1 | 1 | 0 |
| 1 | 0 | 0 | 1 | 1 | 1 | 0 | 1 | 0 | 0 | 0 | 1 | 1 | 0 |
| 0 | 1 | 0 | 0 | 0 | 0 | 1 | 0 | 1 | 0 | 0 | 1 | 1 | 1 |
| 0 | 1 | 0 | 0 | 0 | 1 | 1 | 1 | 1 | 0 | 0 | 1 | 1 | 1 |
| 0 | 1 | 0 | 0 | 1 | 0 | 1 | 0 | 1 | 1 | 0 | 1 | 1 | 1 |
| 0 | 1 | 0 | 0 | 1 | 1 | 1 | 1 | 1 | 1 | 0 | 1 | 1 | 1 |
| 0 | 1 | 0 | 1 | 0 | 0 | 0 | 1 | 1 | 1 | 0 | 0 | 1 | 1 |
| 0 | 1 | 0 | 1 | 0 | 1 | 1 | 1 | 0 | 0 | 0 | 1 | 1 | 1 |
| 0 | 1 | 0 | 1 | 1 | 0 | 0 | 0 | 1 | 1 | 0 | 1 | 1 | 1 |
| 0 | 1 | 0 | 1 | 1 | 1 | 0 | 0 | 1 | 1 | 0 | 0 | 1 | 1 |
| 0 | 0 | 0 | 0 | 0 | 0 | 1 | 1 | 1 | 0 | 0 | 1 | 1 | 0 |
| 0 | 0 | 0 | 0 | 0 | 1 | 1 | 1 | 1 | 0 | 0 | 0 | 1 | 0 |
| 0 | 0 | 0 | 0 | 1 | 0 | 1 | 1 | 1 | 0 | 0 | 0 | 1 | 0 |
| 0 | 0 | 0 | 0 | 1 | 1 | 1 | 1 | 1 | 0 | 0 | 0 | 1 | 0 |
| 0 | 0 | 0 | 1 | 0 | 0 | 1 | 1 | 1 | 0 | 0 | 0 | 1 | 0 |
| 0 | 0 | 0 | 1 | 0 | 1 | -1 | 1 | 1 | 0 | 0 | 1 | 1 | 0 |
| 0 | 0 | 0 | 1 | 1 | 0 | 0 | 1 | 1 | 0 | 0 | 1 | 1 | 0 |
| 0 | 0 | 0 | 1 | 1 | 1 | 0 | 1 | 1 | 0 | 0 | 1 | 1 | 1 |

The internal edge operation of the DEL flip-flop is analyzed in Table II above. The analysis reveals the edge action for ΔT and ∇T transitions with all possible combination of input variables (D, I₀, and I₁) for all possible stable states of Y and Q. The first part of the table is divided into pairs of lines; first having T changed from "0" to "1" [ΔT]; and then having T go from "1" to "0" [∇T]. The first line of each pair indicates the state everything starts at and the second line of each indicates what happens when T changes state. Q⁺ and Y⁺ indicate next state. The last part of Table II indicates the ability of the flip-flop to maintain the correct output Q while the input variables are varied for all possible combinations, and the clock input T is held constant for all possible stable states of Y and Q.

When $\Delta T$ occurs (T going from "0" to "1"), the analysis shows that $S_Y = S_Q = R_Y = R_Q = $ "1" after T goes to "1". This action allows the variables Y and Q to be determined solely by the input states of $D_Y$ and $D_Q$. Thus, the $\Delta T$ function of the DEL flip-flop is accomplished by the positive edge operation of the two positive edge D flip-flops.

When $\nabla T$ occurs (T going from "1" to "0"), the level override inputs $S_Y$, $R_Y$, $S_Q$, and $R_Q$ determine the states of Y and Q because a $\nabla$ edge does not affect the flip-flops. The operation of the DEL flip-flop for the $\nabla T$ function is controlled by the following characteristics of the level override logic:

1. $S_Y = $ "0" and, thus, Y = "1" when Q = "1", T = "0", and either $I_0 = $ "0" or D = "1".
2. $R_Y = $ "0" and, thus, Y = "0" when Q = "0", T = "0", and either $I_0 = $ "0" or D = "0".
3. $S_Q = $ "0" and, thus Q = "1" when Y = "1", T = "0", $I_0 = $ "1", and D = "1".
4. $R_Q = $ "0" and, thus, Q = "0" when Y = "0", T = "0", $I_0 = $ "1", and D = "0".

When $I_0 = $ "1" and Q $\neq$ D, the flip-flop output is required to change when $\nabla T$ occurs. With this condition present, Y does not change because $S_Y = R_Y = $ "1". However, Q changes in the following manner when $\nabla T$ occurs:

1. $S_Q = $ "0", $R_Q = $ "1" and Q becomes "1" when Y = D = "1".
2. $S_Q = $ "1", $R_Q = $ "0" and Q becomes "0" when Y = D = "0".

When $I_0 = $ "0" and/or Q = D, the output is not required to change when $\nabla T$ occurs. With this condition, one of the following actions occurs at $\nabla T$:

1. If Q = "1", T = "0", and $I_0 = $ "0" or D = "1" (the state of Q), then $S_Y = $ "0", $R_Y = $ "1", and Y changes to the state of Q.
2. If Q = "0", T = "0", and $I_0 = $ "0" or D = "0" (the state of Q), then $S_Y = $ "1", $R_Y = $ "0", and Y changes to the state of Q. Because Q = D just prior to $\nabla T$, Y $\neq$ D prior to $\nabla T$. Therefore, when $\nabla T$ occurs, T = "0" and $I_0 = $ "0" and/or Y = D which causes $S_Q = R_Q = $ "1" and, thus, the output Q does not change.

The DEL flip-flop characteristics that allow the device to maintain a stable output while the input variables (D, $I_0$, and $I_1$) are changed without any $\delta T$ action are as follows: ($\delta T = \Delta T$ or $\nabla T$)

1. When Y = Q = T = "0"
   a. Y is held at "0" since $S_Y = $ "1" due to Q = "0"
   b. Q is held at "0" since $S_Q = $ "1" due to Y = "0"
2. When Y = Q = "1" and T = "0"
   a. Y is held at "1" since $R_Y = $ "1" due to Q = "1"
   b. Q is held at "1" since $R_Q = $ "1" due to Y = "1"
3. When Y = "1", Q = "0", and T = "1"
   a. Y is held at "1" since $R_Y = $ "1" due to T = "1"
   b. Q is held at "0" since $S_Q = $ "1" due to T = "1"
4. When Y = "0" and Q = T = "1"
   a. Y is held at "0" since $S_Y = $ "1" due to T = "1"
   b. Q is held at "1" since $R_Q = $ "1" due to T = "1".

We claim:

1. A dual edge flip-flop means having first through fourth input terminals and first and second flip-flop output terminals; first signal means having waveforms which have both positive and negative edges being connected to supply said first input terminal; second and third signals being connected to said second and third input terminals so as to determine that the flip-flop means is sensitive to positive edges, negative edges, or both positive and negative edges of said first signal or is insensitive to said first signal; and a binary signal being fed to said fourth input terminal such that the outputs on the first and second flip-flop output terminals will assume one binary state when the binary signal is a "0" and the opposite state when the binary signal is a "1" when said first signal is fed into said first input terminal to which said second and third signals make the flip-flop sensitive.

2. A flip-flop as set forth in claim 1 further comprising fifth and sixth level input terminals connected to said dual edge flip-flop means so as to make the flip-flop means a dual edge and level flip-flop; and said fifth and sixth inputs overriding the edge operations when either of the inputs are of a predetermined first binary value and not affecting the operation when both fifth and sixth inputs are of the other binary value.

3. A flip-flop as set forth in claim 2 wherein the state of the outputs at first and second output terminals is one value when only said fifth level input terminal is receiving a "0" level and said state reversing at said first and second output terminals when only said sixth level input terminal is receiving a "0".

4. A flip-flop as set forth in claim 3 having circuit means comprising first and second single edge and level flip-flops each having four input terminals and two output terminals; and gating circuitry connected between the input signals and the terminals of said first and second single edge and level flip-flops such that the outputs of one of said single edge and level flip-flops correspond with the output terminals of said dual edge and level flip-flop.

* * * * *